(12) United States Patent
Chen

(10) Patent No.: US 11,950,391 B2
(45) Date of Patent: Apr. 2, 2024

(54) FAN CONTROL DEVICE WITH POWER SAVING MODE AND STARTUP DELAY SETTING

(71) Applicant: Nanjing Greenchip Semiconductor Co., Ltd., Nanjing (CN)

(72) Inventor: Szu-Han Chen, Zhubei (TW)

(73) Assignee: Nanjing Greenchip Semiconductor Co., Ltd., Nanjing (CN)

( * ) Notice: Subject to any disclaimer, the term of this patent is extended or adjusted under 35 U.S.C. 154(b) by 811 days.

(21) Appl. No.: 17/079,425

(22) Filed: Oct. 24, 2020

(65) Prior Publication Data

US 2022/0124940 A1 Apr. 21, 2022

(30) Foreign Application Priority Data

Oct. 20, 2020 (CN) .......................... 202011123412.6

(51) Int. Cl.
  *G06F 1/3206* (2019.01)
  *F04D 27/00* (2006.01)
  *H05K 7/20* (2006.01)

(52) U.S. Cl.
  CPC ....... *H05K 7/20209* (2013.01); *F04D 27/004* (2013.01); *F04D 27/008* (2013.01); *G06F 1/3206* (2013.01)

(58) Field of Classification Search
  CPC .. H05K 7/20209; F04D 27/004; G06F 1/3206
  See application file for complete search history.

(56) References Cited

U.S. PATENT DOCUMENTS

| | | | |
|---|---|---|---|
| 5,513,361 A * | 4/1996 | Young | G06F 1/325 713/320 |
| 5,926,386 A * | 7/1999 | Ott | F04D 27/004 700/277 |
| 6,617,815 B1 * | 9/2003 | Krief | G06F 1/206 318/473 |

* cited by examiner

*Primary Examiner* — Gary Collins
(74) *Attorney, Agent, or Firm* — Chih Feng Yeh; Yongjean Consulting Inc.

(57) ABSTRACT

A fan control device with power saving mode and start-up setting having a control chip, the chip at least includes a main control circuit for controlling a speed of the fan through receiving an external voltage level, a protection control module for sending an alarm signal to the main control circuit while a detected ambient temperature being higher than a preset temperature, and a sleep mode control module electrically coupled to an externally adjustable voltage threshold circuit, wherein the sleep mode control module compares an input voltage threshold from the externally adjustable voltage threshold circuit and an input voltage detected by the protection control module, and sends a control signal to the main control circuit depended on comparing results of the sleep mode control module for controlling operation modes of the fan.

10 Claims, 2 Drawing Sheets

FAN CONTROL DEVICE WITH POWER SAVING MODE AND STARTUP DELAY SETTING

CROSS-REFERENCE TO RELATED APPLICATIONS

The present application is based on, and claims priority from CHINA patent application serial numbered 202011123412.6, the disclosure of which is hereby incorporated by reference in its entirety.

TECHNICAL FIELD

The present invention relates to a fan control device, and more particularly, a fan control device with power saving mode and startup setting.

BACKGROUND

Recently, as processors are achieving speeds of 1 GHz and more, their improvements in speed and system performance will degrade as the increasing amount of heat generated in the internal of the machine. In addition, the developing trend in electronic products, especially consumer electronics, is lean to have smaller product features with enhanced multi-function combinations. Therefore, a large number of electronic components are made into have very small form factor. One obvious example is laptop computers. Thin and light "simplified" laptop computers have been reduced in their sizes, but their processing/computing power has been maintained or even increased. Other examples of this trend include projection systems and other electronic devices. Despite these systems shrink their size, the amount of heat they must dissipate will not decrease; usually it will increase! In laptop computers, most of the heat of each one is generated by the processor; in projectors, most of the heat of each is generated by the light source. The generated heat of these equipments need to be eliminated quietly and effectively.

A good choice for eliminating generated heat is by an active cooling. Fans are introduced into the equipment to generate airflow around them, effectively removing heat from the heating components of the equipment.

Generally speaking, traditional way of fan controlling is usually to drive the fan with a control signal and makes the fan running at full speed for dissipating heat. However, electronic devices could generate various degree of heat under different loads. If the fan is operated at full speed all the time to dissipate heat, not only will the fan generate noise, but will also reduce its service life. The fan is also another mechanical component in the equipment. From a reliability point of view, this is not an ideal solution.

In recent years, people has increasingly paid attentions to the energy consumption of electronic equipments. For example, much stringent energy-saving standards have been promulgated in many countries. Fan speed control devices used for cooling in personal computers and other electronic devices, such as control chips, in addition to those currently used with fan speed control technologies based on the detected temperature, a novel fan control device with finer energy-saving specifications is needed to meet the stricter requirements of future electronic devices for green energy and environmental protection purposes.

SUMMARY

The purpose of the present invention is to provide a fan control device with power saving mode and startup setting having a control chip, the control chip at least includes a main control circuit for controlling a speed of the fan through receiving an external voltage level, a protection control module for sending an alarm signal to the main control circuit while a detected ambient temperature being higher than a preset temperature, and a sleep mode control module electrically coupled to an externally adjustable voltage threshold circuit, wherein the sleep mode control module compares an input voltage threshold from the externally adjustable voltage threshold circuit and an input voltage detected by the protection control module, and sends a control signal to the main control circuit depended on comparing results of the sleep mode control module for controlling operation modes of the fan.

In one preferred embodiment, in a case that an ambient temperature corresponding to the input voltage detected by the protection control module is lower than a preset temperature corresponding to the input voltage threshold from the externally adjustable voltage threshold circuit, the sleep mode control module sends a control signal to the main control circuit for asking the main control circuit to stop the fan.

In one preferred embodiment, in a case that the ambient temperature corresponding to the input voltage detected by the protection control module is higher than the preset temperature corresponding to the input voltage threshold from the externally adjustable voltage threshold circuit again, the sleep mode control module sends another control signal to the main control circuit, after a first period of time, for asking the main control circuit to restart the fan.

In one preferred embodiment, the externally adjustable voltage threshold circuit includes a power source, a first resistor, one end of the first resistor coupled to the power source, a second resistor, one end of the second resistor coupled to the other end of the first resistor, a ground coupled to the other end of the second resistor, and a capacitor been configured to coupled in parallel to the first resistor.

In one preferred embodiment, the first period of time is determined by the first resistor, the second resistor, and the capacitor.

In one preferred embodiment, the main control circuit further includes a capability of setting a speedup start point of the fan by receiving the detected ambient temperature.

In one preferred embodiment, the main control circuit further includes a capability of tuning a slope of fan speed versus temperature by an external coupled adjusting resistor and the detected ambient temperature.

In one preferred embodiment, the external voltage level received by the main control circuit is determined by an external voltage divider coupled to the power source.

In one preferred embodiment, both the protection control module and the sleep mode control module detect the ambient temperature through a common pin of the control chip.

In one preferred embodiment, the main control circuit detects the ambient temperature through an external coupled thermistor.

In one preferred embodiment, the external coupled thermistor has a negative temperature coefficient.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1A:
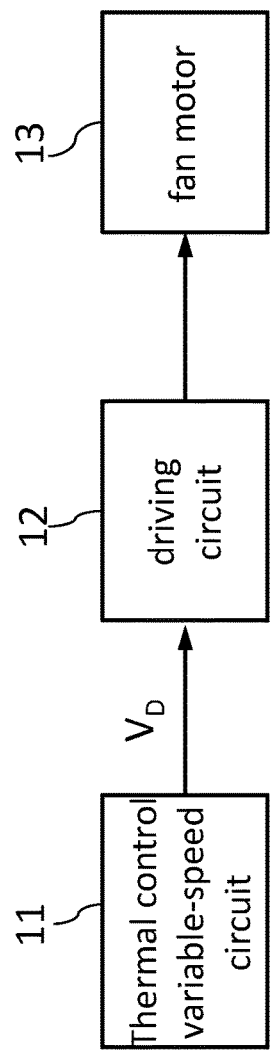
FIG. 1(A) illustrates a functional block diagram of a temperature-controlled fan control device according to an embodiment of the prior art.

Conventionally, as shown in FIG. 1(A), a temperature-controlled fan speed-control device includes a thermal control variable-speed circuit 11 electrically connected to a driving circuit 12 for controlling the speed of a fan motor 13. The thermal control variable-speed circuit 11 is externally connected to a power source Vcc, and outputs a corresponding driving voltage $V_D$ according to the ambient temperature changes. The driving circuit 12 receives the driving voltage $V_D$ to further control the fan motor 13.

Figure 1B:
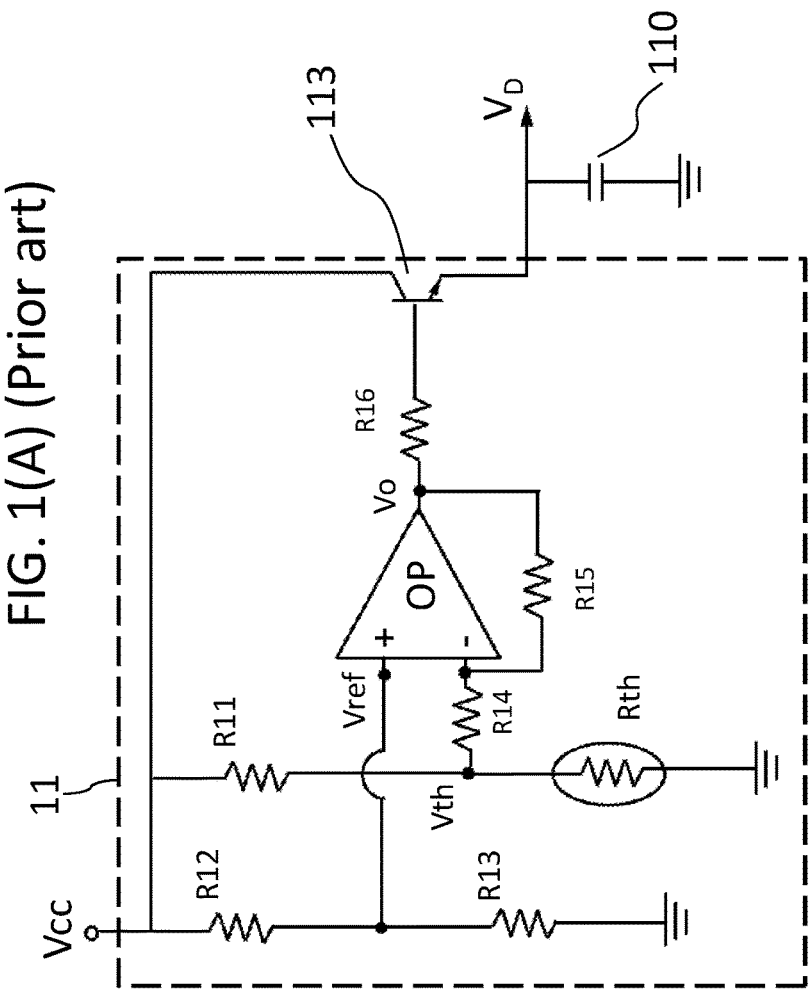
FIG. 1(B) illustrates a circuit diagram of a temperature-controlled fan control device circuitry according to an embodiment of the prior art.

Referring to FIG. 1(B), it shows a circuit diagram of a thermal control variable-speed circuit 11, which includes a temperature detection circuit for detecting ambient temperature, the temperature detection circuit having a resistor R11 is connected to the power supply Vcc from one end and is connected in series to one end of a thermistor Rth from the other end, the other end of the thermistor Rth is grounded, the common node of Rth and R11 is connected to one end of a resistor R14, and the other end of the resistor R14 is connected to the inverting input terminal (−) of an operational amplifier OP, in one embodiment, Rth has a negative temperature coefficient (NTC), i.e. as the ambient temperature rises, the resistance of the thermistor Rth will reduce; a reference voltage circuit is used to set the reference voltage, which includes a resistor R12 connected to the power supply Vcc from one end and connected in series to one end of a resistor R13 from the other end, the other end of the resistor R13 is grounded, and the common node of R12 and R13 is connected to the non-inverting input terminal (+) of the operational amplifier OP.

The aforementioned reference voltage circuit is connected to the OP for outputting a reference voltage signal Vref as a reference voltage setting. A resistor R15 is coupled between the inverting input terminal (−) of the operational amplifier OP and the output terminal of the operational amplifier OP. A resistor R16 is coupled between the output terminal of the operational amplifier OP and the base (B) of the transistor 113, the collector (C) of the transistor 113 is connected to the power supply Vcc, and its emitter (E) is connected to the driving circuit 12 shown in FIG. 1(A). A capacitor 110 is coupled between the emitter (E) of the transistor 113 and ground for filtering the driving voltage $V_D$ transmitted to the fan, therefore reducing the noise of the driving signal.

Analyzing the circuit in FIG. 1(B), the output voltage of the reference voltage circuit (i.e. input voltage of the non-inverting input terminal) Vref is constant as long as the resistors R12 and R13 have been chosen, Vref=Vcc×(R13/(R13+R12)), Vref is input via the non-inverting input terminal (+) of OA as the reference voltage; the voltage across on the thermistor in the temperature detection circuit is Vth, where Vth is equal to Vcc×(Rth/(R11+Rth)), the resistor R14 is coupled between the thermistor Rth and the OP's inverting input terminal (−), and the output voltage of the OP is Vo. By analyzing the OP circuit, the relationship: (Vth−Vref)/R14=(Vref−Vo)/R15, can be obtained, which means Vth=Vref+(Vref−Vo)×(R14/R15). Therefore, when the ambient temperature decreases, Rth will increase and Vth become higher, causing the output voltage Vo of the OP decreases due to values of Vref, R14 and R15 been fixed; similarly, when the ambient temperature increases, Rth will decrease and Vth become lower, causing the output voltage Vo of the OP rises. That is, the output voltage Vo of the operational amplifier OP increases as the temperature increases and decreases as the temperature decreases. This voltage Vo is used to drive the base-emitter (B-E) of the NPN transistor 113 to turn on the transistor 113 and to drive the fan running at a variable speed. The output drive voltage $V_D$ of the NPN transistor 113 is proportional to this voltage. When the voltage Vth across on the thermistor changes linearly, the transistor circuit is driven by the amplifier OP, and the transistor circuit drives and changes the speed of the fan, therefore linearly controlling the speed of the fan motor 13 can be achieved.

Based on the aforementioned conventional temperature-controlled fan speed-control device, the present invention proposes a fan control device with finer energy-saving specifications, which can provide a power-saving mode and startup delay setting function for fan controlling.

Figure 2:
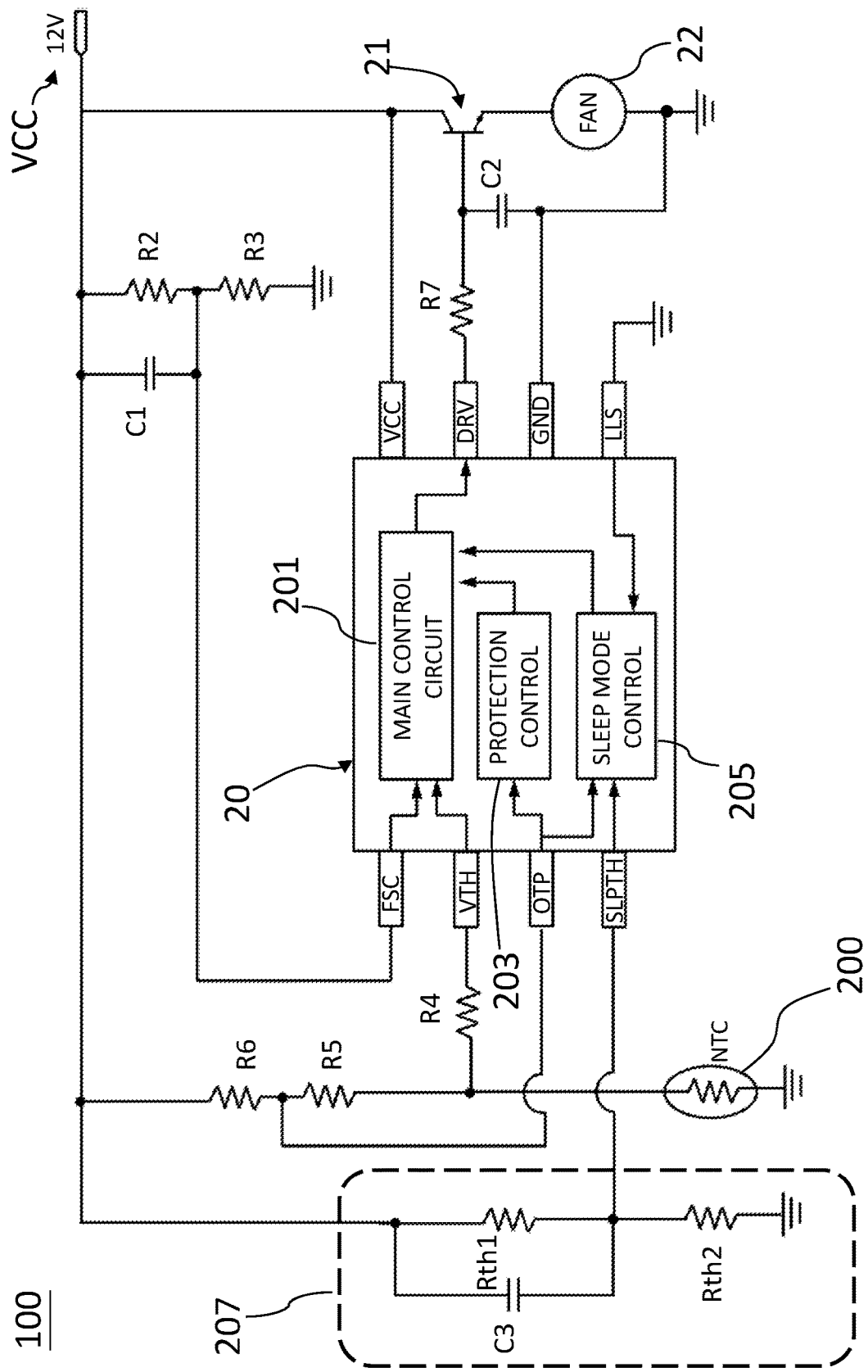
FIG. 2 illustrates a functional block diagram of a fan control device with power saving mode and startup delay setting according to a preferred embodiment of the present invention.

Referring to FIG. 2, it illustrates a functional block diagram of a fan control device 100 with power saving mode and startup delay setting according to a preferred embodiment of the present invention. In FIG. 2, it clearly shows that the operation of a fan 22 is controlled by a control chip 20 according to one embodiment of the present invention, where the control chip 20 can be realized as an integrated circuitry (IC). FSC pin of the control chip 20 is used to set minimum output voltage of DRV pin (set the idle speed of fan), the voltage level is determine by a voltage divider, $V_{FSC}=(R3/(R2+R3))\times VCC$, which can be received by a main control circuit 201 and then the main control circuit 201 outputs a control signal via the DRV pin to control the operation of transistor 21 for adjusting the fan speed. VCC is a power source externally coupled to the control chip 20, R2 and R3 are resistors of a voltage divider accordingly, resistor R7 is externally coupled between DRV pin and base (B) of the transistor 21, collector (C) of the transistor 21 is coupled to power source VCC, and the fan 22 is coupled between emitter (E) of the transistor 21 and ground. VTH pin of the control chip 20 is externally coupled to one end of a thermistor 200 via a resistor R4, the common node of R4 and thermistor 200 is coupled to one end of resistor R5, the other end of R5 is coupled to one end of resistor R6, and the other end of R6 is coupled to VCC. In one embodiment, the thermistor 200 has a negative temperature coefficient (NTC) for detecting ambient temperature. The main control circuit 201 inside the control chip 21 can set a speedup start point of a fan by receiving a corresponding voltage of the thermistor 200, tune the slope of fan speed v.s. temperature ($Slope_{svt}$) through an adjusting resistor R4, output control signal via DRV pin to increase fan speed as the detected ambient temperature increases (i.e. speedup the fan speed proportional to the detected ambient temperature with a positive slope), and drive fan to maximum speed after the detected ambient temperature reach a preset temperature $T_s$, for example 70° C., in one embodiment, $Slope_{svt}$ is determined by resistors R4, R5 and R6, and the thermistor $R_{NTC}$. OTP pin of the control chip 20 is externally connected to a common node of resistors R5 and R6, a protection control module 203 receives input voltage via the OTP pin. When the received voltage of OTP pin is lower than a predetermined value, i.e. its corresponding temperature is higher than a set temperature $T_{OTP}$, for example 120° C., the protection control module 203 will send an alarm signal to alert user, and the DRV pin will output 12V to drive fan 22 as maximum fan speed. To further improve energy-saving specifications of the fan control device 100, additional functions and external pins are introduced. SLPTH pin of the control chip 20 is connected externally to a programmable R/C circuit (or call it as an externally adjustable voltage threshold circuit) 207, which includes a first resistor Rth1 with one end coupled to VCC, the other end of Rth1 is connected in series to one end of a second resistor Rth2, the other end of Rth2 is coupled to ground, and a capacitor C3 is coupled in parallel with Rth1. Where the SLPTH pin in connected to the common node of Rth1 and Rth2, and VCC is a +12V power source. A sleep mode control module 205 compares input voltage of SLPTH pin V_SLPTH and input voltage of the OTP pin $V_{OTP}$, where both V_SLPTH and $V_{OTP}$ can be converted to their corresponding temperatures $T_{th}$ and $T_{am}$, respectively. When the detected ambient temperature $T_{am}$ is lower than the temperature $T_{th}$ set by the externally adjustable voltage threshold circuit 207, a light load selection (LLS) pin will enable an idle mode located inside the sleep mode control module 205, enabling the sleep mode control module 205 to output an signal to the main control circuit 201 for asking the main control circuit 201 to output a control signal via the DRV pin to stop the fan 22 (fan 22 is in idle mode). After fan 22 entering an idle mode, the control chip 20 continuously detects ambient temperature $T_{am}$ changes, when the detected ambient temperature $T_{am}$ is higher than the temperature $T_{th}$ again, the LLS pin will disable the idle mode located inside the sleep mode control module 205, after a delay time period τ0 enabling the sleep mode control module 205 to output another signal to the main control circuit 201 for asking the main control circuit 201 to output a control signal via the DRV pin to restart the fan 22. In one preferred embodiment, V_SLPTH is be determined by the voltage divider circuit consisting of VCC, Rth1, Rth2, and ground; the delay time period τ0 is determined by the Rth1, Rth2, and C3 (i.e. τ0=C3×(Rth1//Rth2), where "//" means coupled in parallel).

The fan control device proposed in the present invention, which can program temperature control and delay time period of restart fan as well through an externally connected circuit with adjustable voltage threshold and programmable R/C functions. The circuit mentioned can enable the fan control device to stop the fan and to enter into idle mode as the temperature detected by the device is lower than a temperature set by the circuit; the circuit can restart the fan after a predetermined delay time period when the detected temperature is higher than the set temperature again while the device is in idle mode.

While the present invention has been particularly shown and described with reference to certain exemplary embodiments thereof, it will be understood by those of ordinary skill in the art that various changes in form and detail may be made to the circuit of the fan control device described above. Therefore, it should be noted that the contents included in the above description and shown in the drawings should be interpreted in an illustrative rather than restrictive sense. The scope of the following patent applications is intended to cover all the general features and specific features described in this article, as well as all statements in the scope of the fan control device with power-saving mode and start-up delay set in the present invention, therein without departing from the spirit and scope of the present invention as defined by the appended claims.

What is claimed is:

1. A fan control device with power saving mode and startup setting, comprising:
    a control chip, the control chip at least including:
        a main control circuit configured to control a speed of the fan through receiving an external voltage level, the external voltage level determined by an external voltage divider coupled to a power source;
        a protection control module configured to receive an input voltage corresponding to ambient temperature for sending an alarm signal to the main control circuit while a detected ambient temperature being higher than a preset temperature; and
        a sleep mode control module electrically coupled to an externally adjustable voltage threshold circuit, the externally adjustable voltage threshold circuit comprising the power source, a first resistor with one end of the first resistor coupled to the power source, a second resistor with one end of the second resistor coupled in series to the other end of the first resistor, a ground coupled to the other end of the second resistor, and a capacitor being configured to coupled in parallel to the first resistor;
        wherein the sleep mode control module compares an input voltage threshold from the externally adjustable voltage threshold circuit and the input voltage detected by the protection control module, and sends a control signal to the main control circuit depended on comparing results of the sleep mode control module for controlling operation modes of the fan.

2. The fan control device with power saving mode and startup setting of claim 1, in a case that an ambient temperature corresponding to the input voltage detected by the protection control module is lower than a preset temperature corresponding to the input voltage threshold from the externally adjustable voltage threshold circuit, the sleep mode control module sends a control signal to the main control circuit for asking the main control circuit to stop the fan.

3. The fan control device with power saving mode and startup setting of claim 2, in a case that the ambient temperature corresponding to the input voltage detected by the protection control module is higher than the preset temperature corresponding to the input voltage threshold from the externally adjustable voltage threshold circuit again, the sleep mode control module sends another control signal to the main control circuit, after a first period of time, for asking the main control circuit to restart the fan.

4. The fan control device with power saving mode and startup setting of claim 3, wherein the first period of time is determined by the first resistor, the second resistor, and the capacitor.

5. The fan control device with power saving mode and startup setting of claim 1, wherein the main control circuit further includes a capability of setting a speedup start point of the fan by receiving the detected ambient temperature.

6. The fan control device with power saving mode and startup setting of claim 1, wherein the main control circuit further includes a capability of tuning slope of fan speed versus temperature by an external coupled adjusting resistor and the detected ambient temperature.

7. The fan control device with power saving mode and startup setting of claim 1, wherein the external voltage level received by the man control circuit is determined by an external voltage divider coupled to the power source.

8. The fan control device with power saving mode and startup setting of claim 1, wherein both the protection control module and the sleep mode control module detect the ambient temperature through a common pin of the control chip.

9. The fan control device with power saving mode and startup setting of claim 1, wherein the main control circuit detects the ambient temperature through an external coupled thermistor.

10. The fan control device with power saving mode and startup setting of claim 9, wherein the external coupled thermistor has a negative temperature coefficient.

* * * * *